(12) United States Patent
Takeuchi

(10) Patent No.: US 8,847,699 B2
(45) Date of Patent: Sep. 30, 2014

(54) COMPOSITE COMPONENT

(71) Applicant: Murata Manufacturing Co., Ltd., Nagaokakyo (JP)

(72) Inventor: Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/654,524

(22) Filed: Oct. 18, 2012

(65) Prior Publication Data

US 2013/0278350 A1    Oct. 24, 2013

Related U.S. Application Data

(63) Continuation of application No. PCT/JP2011/059698, filed on Apr. 20, 2011.

(30) Foreign Application Priority Data

Apr. 30, 2010    (JP) ................. 2010-105605

(51) Int. Cl.
| | |
|---|---|
| H01P 5/12 | (2006.01) |
| H03H 7/46 | (2006.01) |
| H03H 9/72 | (2006.01) |
| H03H 7/01 | (2006.01) |
| H04B 1/44 | (2006.01) |
| H03H 9/05 | (2006.01) |

(52) U.S. Cl.
CPC ............. *H03H 7/0138* (2013.01); *H03H 9/725* (2013.01); *H03H 7/463* (2013.01); *H04B 1/44* (2013.01); *H03H 9/0576* (2013.01)
USPC .......................................... 333/132; 333/126

(58) Field of Classification Search
USPC .................... 333/125–129, 132, 134
See application file for complete search history.

(56) References Cited

U.S. PATENT DOCUMENTS

| | | | |
|---|---|---|---|
| 6,756,864 B2 | 6/2004 | Muramatsu | |
| 7,573,354 B2 * | 8/2009 | Nishihara et al. | ............. 333/133 |

(Continued)

FOREIGN PATENT DOCUMENTS

| | | |
|---|---|---|
| EP | 2 031 755 A1 | 3/2009 |
| JP | 2004-080233 A | 3/2004 |

(Continued)

OTHER PUBLICATIONS

Official Communication issued in International Patent Application No. PCT/JP2011/059698, mailed on Jul. 19, 2011.
Official Communication issued in corresponding European Patent Application No. 11774883.0, mailed on Apr. 10, 2014.

*Primary Examiner* — Robert Pascal
*Assistant Examiner* — Kimberly Glenn
(74) *Attorney, Agent, or Firm* — Keating & Bennett, LLP

(57) ABSTRACT

A circuit substrate on which a duplexer is mounted includes a substrate body. First, second and third external electrodes are provided on a first main surface of the substrate body. Fourth, fifth and sixth external electrodes are provided on a second main surface of the substrate body. First, second and third signal paths connect the first, second and third external electrodes to the fourth, fifth and sixth external electrodes, respectively. First and second ground conductors are embedded in the substrate body, and overlap with a mounting area so as to contain the mounting area where the duplexer is mounted, in a planar view seen from the z-axis direction. The first, second and third signal paths extend from the inside of the mounting area to the outside of the mounting area between the first main surface and the second ground conductor.

20 Claims, 5 Drawing Sheets

(56) References Cited

U.S. PATENT DOCUMENTS

| | | | |
|---|---|---|---|
| 2004/0060015 A1 | 3/2004 | Mochizuki | |
| 2004/0212451 A1 | 10/2004 | Iwamoto et al. | |
| 2005/0287966 A1 | 12/2005 | Yoshimi et al. | |
| 2008/0068109 A1* | 3/2008 | Schmidhammer | 333/133 |
| 2010/0319975 A1 | 12/2010 | Tsutsumi et al. | |
| 2013/0002371 A1* | 1/2013 | Ono | 333/126 |
| 2013/0106530 A1* | 5/2013 | Tajima et al. | 333/133 |

FOREIGN PATENT DOCUMENTS

| | | |
|---|---|---|
| JP | 2004-102799 A | 4/2004 |
| JP | 2006-013753 A | 1/2006 |
| JP | 2006-295530 A | 10/2006 |
| JP | 2010-068079 A | 3/2010 |
| WO | 2009/104251 A1 | 8/2009 |

* cited by examiner

COMPOSITE COMPONENT

BACKGROUND OF THE INVENTION

1. Field of the Invention

The present invention relates to a composite component, and more specifically, relates to a composite component in which a duplexer is mounted.

2. Description of the Related Art

As a composite component of the related art, for example, an antenna switch module described in Japanese Unexamined Patent Application Publication No. 2006-295530 is known. In the corresponding antenna switch module, a transmission signal and a reception signal are separated in a plurality of communication methods received through an antenna. In addition, the separated transmission signal and reception signal are transmitted within a laminated dielectric. In such an antenna switch module, it is necessary to reduce unnecessary interference occurring between the transmission signal and the reception signal.

However, the antenna switch module described in Japanese Unexamined Patent Application Publication No. 2006-295530 has a problem in that it is difficult to sufficiently reduce unnecessary interference occurring between the transmission signal and the reception signal. In more detail, a ground conductor is provided between a transmission path through which the transmission signal is transmitted and a transmission path through which the reception signal is transmitted. Accordingly, in the antenna switch module, it has been intended to reduce unnecessary interference occurring between the transmission signal and the reception signal. However, in the antenna switch module, since the area of the ground conductor is small, it is difficult to sufficiently reduce unnecessary interference occurring between the transmission signal and the reception signal.

SUMMARY OF THE INVENTION

Therefore, preferred embodiments of the present invention significantly reduce unnecessary interference occurring between various types of signals in a composite component in which a duplexer that separates various types of signals such as transmission and reception signals is mounted.

A composite component according to a preferred embodiment of the present invention includes a duplexer, and a circuit substrate where the duplexer is mounted, wherein the duplexer includes a first external electrode, a second external electrode and a third external electrode, a first filter that outputs a signal input from the first external electrode to the second external electrode, and a second filter that outputs a signal input from the third external electrode to the first external electrode, and the circuit substrate includes a substrate body that includes a first main surface and a second main surface and where the duplexer is mounted on the first main surface, a fourth external electrode, a fifth external electrode, and a sixth external electrode that are provided on the first main surface and to which the first external electrode to the third external electrode are connected, respectively, a seventh external electrode, an eighth external electrode, and a ninth external electrode that are provided on the second main surface, a first signal path that connects the fourth external electrode and the seventh external electrode, a second signal path that connects the fifth external electrode and the eighth external electrode, a third signal path that connects the sixth external electrode and the ninth external electrode, and a first ground conductor that is embedded in the substrate body and overlaps with a mounting area so as to contain the mounting area where the duplexer is mounted, in a planar view seen from a normal direction of the first main surface, wherein, in a planar view seen from the normal direction of the first main surface, at least one of the first signal path, the second signal path and the third signal path extends from an inside of the mounting area to an outside of the mounting area between the first main surface and the first ground conductor, passes through the outside of the mounting area, and is connected to the seventh external electrode, the eighth external electrode, and the ninth external electrode.

According to various preferred embodiments of the present invention, it is possible to significantly reduce unnecessary interference occurring between various types of signals in a composite component in which a duplexer that separates various types of signals is mounted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a circuit module according to preferred embodiments of the present invention will be described with reference to drawings.

Figure 1A:
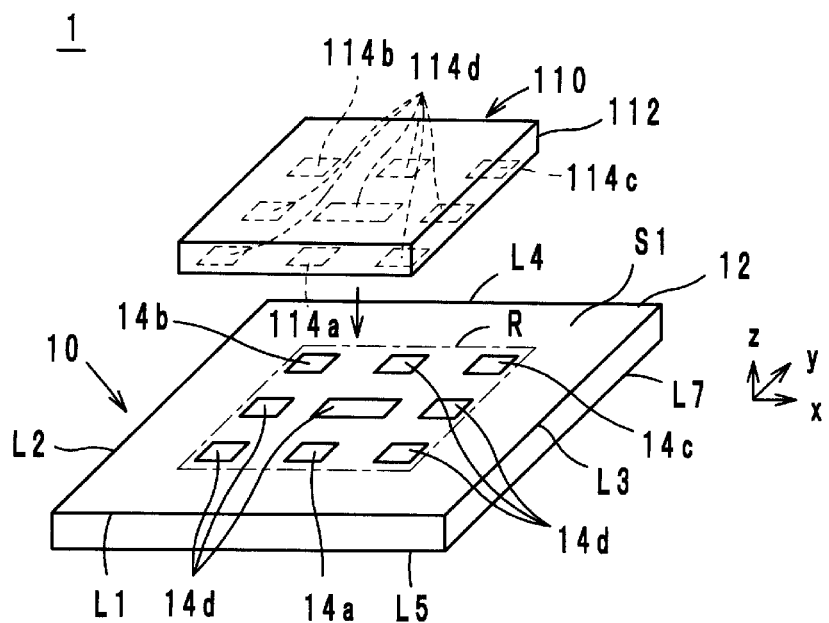
FIGS. 1A and 1B are external appearance perspective views of a circuit module according to a preferred embodiment of the present invention.
Figure 1B:
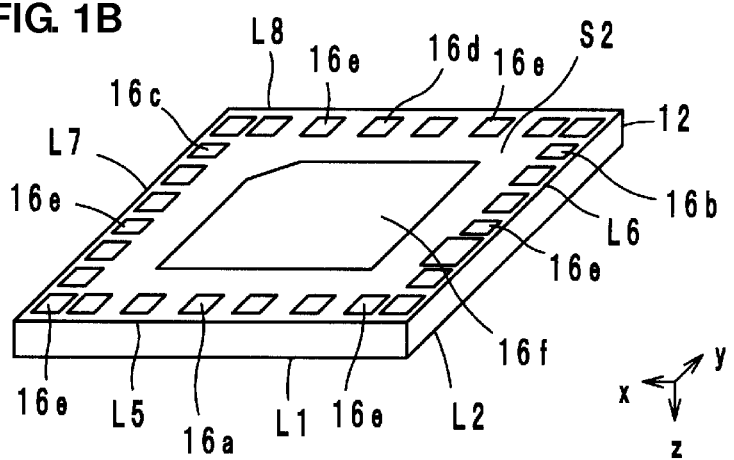
Figure 2:
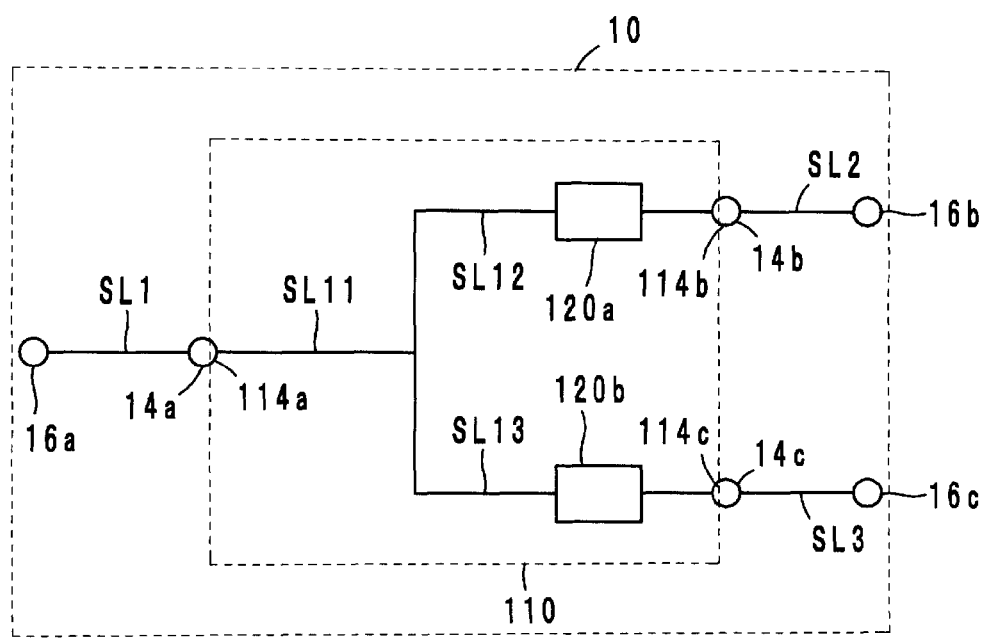
FIG. 2 is a circuit diagram of the circuit module according to a preferred embodiment of the present invention.
Figure 3:
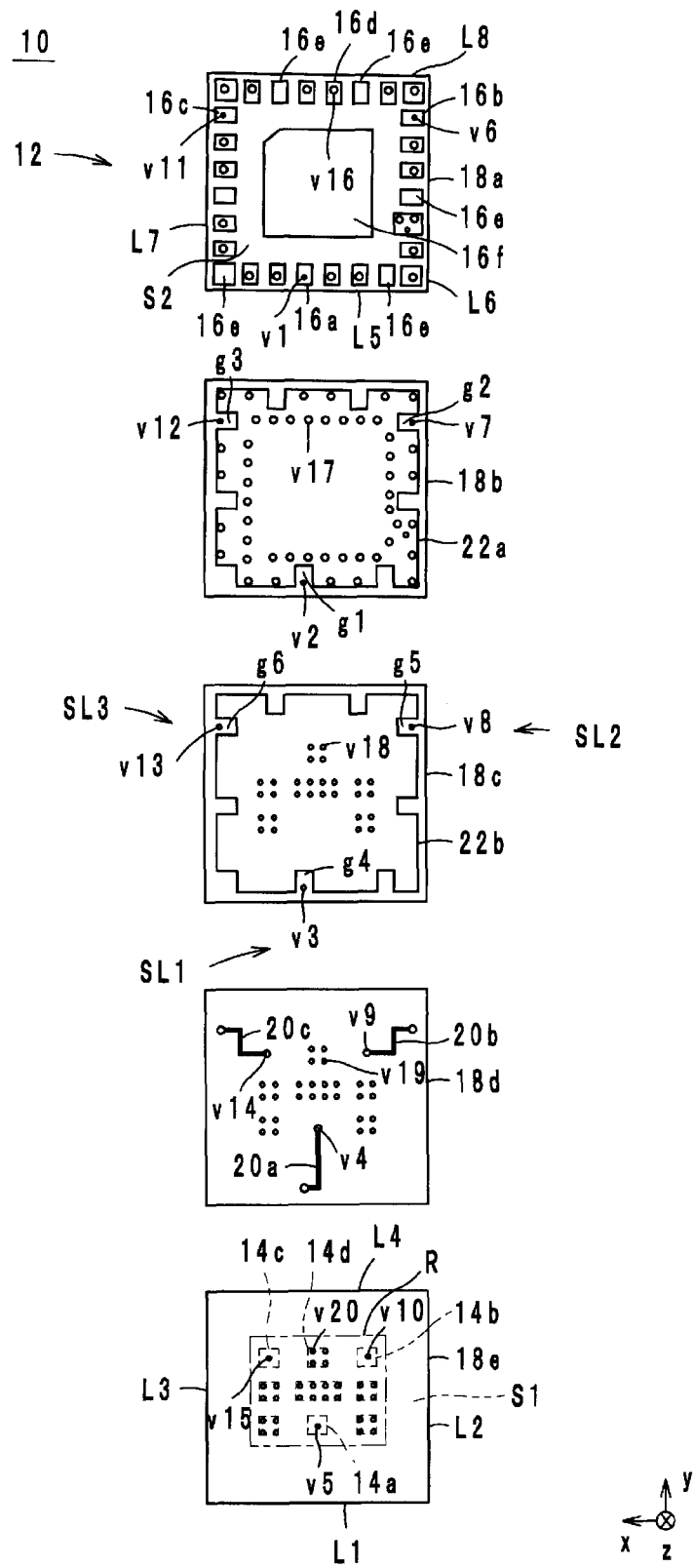
FIG. 3 is an exploded view of a circuit substrate of the circuit module according to a preferred embodiment of the present invention.

First, the configuration of the circuit module will be described with reference to drawings. FIGS. 1A and 1B are external appearance perspective views of a circuit module 1 according to a preferred embodiment of the present invention. FIG. 1A is a view when the circuit module 1 is viewed from above, and FIG. 1B is a view when the circuit module 1 is viewed from below. FIG. 2 is the circuit diagram of the circuit module 1. FIG. 3 is the exploded view of a circuit substrate 10 of the circuit module 1.

Hereinafter, the lamination direction of the circuit substrate 10 is defined as a z-axis direction. Directions in which individual sides of the circuit substrate 10 extend when the planar view of the circuit substrate 10 is seen from the z-axis direction are defined as an x-axis direction and a y-axis direction. In FIGS. 1A and 1B, it is assumed that the horizontal direction of the plane of paper corresponds to the x-axis direction and the longitudinal direction of the plane of paper corresponds to the y-axis direction. The x-axis direction, the y-axis direction, and the z-axis direction are perpendicular to one another.

The circuit module 1 is mounted on the motherboard of a communication device such as a mobile phone, and used as a portion of the transmission and reception circuit of the mobile phone. As illustrated in FIGS. 1A and 1B, the circuit module 1 includes the circuit substrate 10 and a duplexer 110.

First, the configuration of the duplexer 110 will be described. As illustrated in FIGS. 1A and 1B and FIG. 2, the duplexer 110 includes a main body 112, external electrodes 114 (114a to 114d), and SAW filters 120a and 120b (not illustrated in FIG. 1).

The main body 112 preferably is a rectangular or substantially rectangular parallelepiped-shaped laminated body, and configured by, for example, laminating an insulator layer including ceramics. As illustrated in FIG. 1, the external electrodes 114 are provided on a main surface on a negative direction side in the z-axis direction of the main body 112, and arranged in an array of three rows and three columns, for example. The external electrode 114a (first external electrode) is provided in the second row and the first column. The external electrode 114b (second external electrode) is provided in the first row and the third column. The external electrode 114c (third external electrode) is provided in the third row and the third column. The external electrodes 114d are the other six external electrodes 114 other than the external electrodes 114a to 114c.

As illustrated in FIG. 2, the external electrode 114a and the external electrodes 114b and 114c are connected via signal paths SL11 to SL13. In more detail, the signal path SL11 is connected to the external electrode 114a. The signal paths SL12 and SL13 preferably branch into two from the signal path SL11. In addition, the external electrodes 114b and 114c are connected to the signal paths SL12 and SL13, respectively.

The SAW filters 120a and 120b are filters whose pass bands are different frequency bands, and the SAW filters 120a and 120b are mounted in the main body 112. The SAW filters 120a and 120b are preferably coated using a resin, a metal case, or the like. In more detail, as illustrated in FIG. 2, the SAW filter 120a is provided on the signal path SL12, and a filter whose pass band is the frequency band (for example, 1.95 GHz) of a transmission signal. In addition, the SAW filter 120a only outputs, to the external electrode 114a, a high-frequency signal in the frequency band of the transmission signal among high-frequency signals input from the external electrode 114b. As illustrated in FIG. 2, the SAW filter 120b is provided on the signal path SL13, and a filter whose pass band is the frequency band (for example, 2.14 GHz) of a reception signal. In addition, the SAW filter 120b only outputs, to the external electrode 114c, a high-frequency signal in the frequency band of the reception signal among high-frequency signals input from the external electrode 114a. In addition, the SAW filters 120a and 120b are manufactured preferably by forming a comb-shaped electrode on a piezoelectric substrate such as crystal and mounting the piezoelectric substrate on a base substrate such as aluminum oxide. At this time, an integrated duplexer may also be formed preferably by mounting, on a same base substrate, the piezoelectric substrate in which the SAW filters 120a and 120b are to be provided. In addition, each of the SAW filters 120a and 120b may also be mounted in a different base substrate, and by mounting these in the circuit substrate 10, the duplexer may also be formed.

Next, the configuration of the circuit substrate 10 will be described. As illustrated in FIGS. 1A and 1B, and FIG. 3, the circuit substrate 10 includes a substrate body 12 and external electrodes 14 (14a to 14d) and 16 (16a to 16f).

The substrate body 12 preferably is a rectangular or substantially rectangular parallelepiped-shaped laminated body, and as illustrated in FIG. 3, configured preferably by laminating insulator layers 18 (18a to 18e). Hereinafter, a main surface on a positive direction side in the z-axis direction of the substrate body 12 is defined as a main surface S1, and a main surface on a negative direction side in the z-axis direction of the substrate body 12 is defined as a main surface S2. Furthermore, a side on a negative direction side in the y-axis direction of the main surface S1 is defined as a side L1, a side on a negative direction side in the x-axis direction of the main surface S1 is defined as a side L2, a side on a positive direction side in the x-axis direction of the main surface S1 is defined as a side L3, and a side on a positive direction side in the y-axis direction of the main surface S1 is defined as a side L4. A side on a negative direction side in the y-axis direction of the main surface S2 is defined as L5, a side on a negative direction side in the x-axis direction of the main surface S2 is defined as L6, a side on a positive direction side in the x-axis direction of the main surface S2 is defined as L7, and a side on a positive direction side in the y-axis direction of the main surface S2 is defined as L8. In addition, in the substrate body 12, in a planar view seen from the z-axis direction (the normal direction of the main surface S1), an area in which the duplexer 110 is mounted is defined as a mounting area R.

The insulator layers 18 are configured preferably using, for example, ceramics, and rectangular in shape as illustrated in FIG. 3. The insulator layers 18a to 18e are laminated from the negative direction side of the z-axis direction toward the positive direction side thereof so as to be arranged in this order. Hereinafter, a surface on a positive direction side in the z-axis direction of the insulator layer 18 is referred to as a front surface, and a surface on a negative direction side in the z-axis direction of the insulator layer 18 is referred to as a back surface. The main surface S1 of the substrate body 12 is configured by the front surface of the insulator layer 18e, and the main surface S2 of the substrate body 12 is configured by the back surface of the insulator layer 18a.

As illustrated in FIG. 1 and FIG. 3, the external electrode 14 is provided on the main surface S1 of the substrate body 12 (namely, the front surface of the insulator layer 18e), and arranged so as to correspond to the external electrode 114 and in an array of three rows and three columns, for example. The external electrode 14a (fourth external electrode) is provided in the second row and the first column. The external electrode 14b (fifth external electrode) is provided in the first row and the third column. The external electrode 14c (sixth external electrode) is provided in the third row and the third column. The external electrodes 14d (tenth external electrode) are the other six external electrodes 14 other than the external electrodes 14a to 14c. Accordingly, when the duplexer 110 is mounted in the circuit substrate 10, the external electrodes 14a to 14d are connected to the external electrodes 114a to 114d, respectively. Therefore, as illustrated in FIG. 1 and FIG. 3, in a planar view seen from the z-axis direction, the external electrodes 14a to 14d are located inside the mounting area R.

As illustrated in FIG. 1, the external electrodes 16 are provided on the main surface S2 of the substrate body 12 (namely, the back surface of the insulator layer 18a), and arranged in the center of the main surface S2 and along the outer edge of the main surface S2. In more detail, as illustrated in FIG. 3, the external electrode 16a is located closest to the side L5 among the sides L5 to L8. In the present preferred embodiment, the external electrode 16a (seventh external electrode) is provided in the vicinity of the middle point of the side L5. As illustrated in FIG. 3, the external electrode 16b (eighth external electrode) is located closest to the side L6 among the sides L5 to L8. In the present preferred embodiment, the external electrode 16b is provided in the vicinity of an end portion on a positive direction side in the y-axis direction of the side L6. As illustrated in FIG. 3, the external electrode 16c (ninth external electrode) is located closest to the side L7 among the sides L5 to L8. In the present preferred embodiment, the external electrode 16c is provided in the vicinity of an end portion on a positive direction side in the y-axis direction of the side L7.

As illustrated in FIG. 3, the external electrode 16f (eleventh external electrode) is provided in the center of the main surface S2, and has an area larger than the external electrodes 16a to 16e. As illustrated in FIG. 3, the external electrodes 16d and 16e are arranged along the outer edge of the main surface S2 along with the external electrodes 16a to 16c. Accordingly, in a planar view seen from the z-axis direction, the external electrodes 16a to 16e do not overlap with the mounting area R. In addition, in FIG. 1 and FIG. 3, so as to avoid the drawing from being complicated, with respect to the external electrode 16d, a reference symbol is assigned to only a typical external electrode 16d.

Next, the internal configuration of the circuit substrate 10 will be described. The circuit substrate 10 includes wiring conductors 20 (20a to 20c), ground conductors 22 (22a and 22b), and via hole conductors v (v1 to v20).

As illustrated in FIG. 3, the ground conductors 22a and 22b are provided on the back surfaces of the insulator layers 18b and 18c, respectively, and hence, embedded in the substrate body 12. Therefore, the ground conductor 22a (second ground electrode) is located on a negative direction in the z-axis direction compared with the ground conductor 22b (first ground electrode). Accordingly, the ground conductor 22a is provided between the main surface S2 and the ground conductor 22b. The ground conductors 22a and 22b cover substantially the entire back surfaces of the insulator layers 18b and 18c, and hence, overlap with the mounting area R so as to contain the mounting area R in a planar view seen from the z-axis direction. In this regard, however, the outer edges of the ground conductors 22a and 22b are located slightly inside the outer edges of the insulator layers 18b and 18c, respectively, and are not in contact with the outer edges of the insulator layers 18b and 18c. Furthermore, in the outer edges of the ground conductors 22a and 22b, dents g1 to g6 are provided.

The via hole conductors v1 to v5 and the wiring conductor 20a configure the signal path SL1 (refer to FIG. 2) connecting the external electrode 14a and the external electrode 16a. As illustrated in FIG. 3, the via hole conductor v5 penetrates the insulator layer 18e in the z-axis direction, and is connected to the external electrode 14a. Accordingly, the via hole conductor v5 is located inside the mounting area R in a planar view seen from the z-axis direction.

As illustrated in FIG. 3, the wiring conductor 20a is a linear conductor provided on the back surface of the insulator layer 18d. In a planar view seen from the z-axis direction, one end of the wiring conductor 20a is connected to the via hole conductor v5. Accordingly, the one end of the wiring conductor 20a is located inside the mounting area R in a planar view seen from the z-axis direction. The other end of the wiring conductor 20a overlaps with the external electrode 16a in a planar view seen from the z-axis direction. Accordingly, the other end of the wiring conductor 20a is located outside the mounting area R in a planar view seen from the z-axis direction. In addition, the other end of the wiring conductor 20a is located nearest to the side L1 among the sides L1 to L4 in a planar view seen from the z-axis direction. In this way, in a planar view seen from the z-axis direction, the wiring conductor 20a extends from the inside of the mounting area R to the outside of the mounting area R between the main surface S1 and the ground conductor 22b.

As illustrated in FIG. 3, the via hole conductor v1 penetrates the insulator layer 18a in the z-axis direction, and is connected to the external electrode 16a. The via hole conductors v2 and v3 penetrate the insulator layers 18b and 18c in the z-axis direction, respectively, and overlap with the via hole conductor v1 in a planar view seen from the z-axis direction. Accordingly, the via hole conductors v1 to v3 (first via hole conductor) are located outside the mounting area R in a planar view seen from the z-axis direction. Furthermore, the via hole conductor v3 is connected to the other end of the wiring conductor 20a. Therefore, the via hole conductors v1 to v3 are provided nearest to the side L1 among the sides L1 to L4 in a planar view seen from the z-axis direction. Accordingly, in a planar view seen from the z-axis direction, the via hole conductors v1 to v3 connect the wiring conductor 20a and the external electrode 16a outside the mounting area R.

Furthermore, the via hole conductors v2 and v3 pass through the dents g1 and g4 provided in the ground conductors 22a and 22b, respectively. Accordingly, the via hole conductors v1 to v3 are not connected to the ground conductors 22a and 22b.

As illustrated in FIG. 2 and FIG. 3, the signal path SL1 configured in such a way as described above connects the external electrode 14a and the external electrode 16a. Furthermore, in a planar view seen from the z-axis direction, the signal path SL1 extends from the inside of the mounting area R to the outside of the mounting area R between the main surface S1 and the ground conductor 22b, passes through the outside of the mounting area R, and is connected to the external electrode 16a.

The via hole conductors v6 to v10 and the wiring conductor 20b configure the signal path SL2 (refer to FIG. 2) connecting the external electrode 14b and the external electrode 16b. As illustrated in FIG. 3, the via hole conductor v10 penetrates the insulator layer 18e in the z-axis direction, and is connected to the external electrode 14b. Accordingly, the via hole conductor v10 is located inside the mounting area R in a planar view seen from the z-axis direction.

As illustrated in FIG. 3, the wiring conductor 20b is a linear conductor provided on the back surface of the insulator layer 18d. In a planar view seen from the z-axis direction, one end of the wiring conductor 20b is connected to the via hole conductor v10. Accordingly, the one end of the wiring conductor 20b is located inside the mounting area R in a planar view seen from the z-axis direction. The other end of the wiring conductor 20b overlaps with the external electrode 16b in a planar view seen from the z-axis direction. Accordingly, the other end of the wiring conductor 20b is located outside the mounting area R in a planar view seen from the z-axis direction. In addition, the other end of the wiring conductor 20b is located nearest to the side L2 among the sides L1 to L4 in a planar view seen from the z-axis direction. In this way, in a planar view seen from the z-axis direction, the wiring conductor 20b extends from the inside of the mounting area R to the outside of the mounting area R between the main surface S1 and the ground conductor 22b.

As illustrated in FIG. 3, the via hole conductor v6 penetrates the insulator layer 18a in the z-axis direction, and is connected to the external electrode 16b. The via hole conductors v7 and v8 penetrate the insulator layers 18b and 18c in the z-axis direction, respectively, and overlap with the via hole conductor v6 in a planar view seen from the z-axis direction. Accordingly, the via hole conductors v6 to v8 (second via hole conductor) are located outside the mounting area R in a planar view seen from the z-axis direction. Furthermore, the via hole conductor v8 is connected to the other end of the wiring conductor 20b. Therefore, the via hole conductors v6 to v8 are provided nearest to the side L2 among the sides L1 to L4 in a planar view seen from the z-axis direction. Accordingly, in a planar view seen from the z-axis direction, the via hole conductors v6 to v8 connect the wiring conductor 20b and the external electrode 16b outside the mounting area R.

Furthermore, the via hole conductors v7 and v8 pass through the dents g2 and g5 provided in the ground conductors 22a and 22b, respectively. Accordingly, the via hole conductors v6 to v8 are not connected to the ground conductors 22a and 22b.

As illustrated in FIG. 2 and FIG. 3, the signal path SL2 configured in such a way as described above connects the external electrode 14b and the external electrode 16b. Furthermore, in a planar view seen from the z-axis direction, the signal path SL2 extends from the inside of the mounting area R to the outside of the mounting area R between the main surface S1 and the ground conductor 22b, passes through the outside of the mounting area R, and is connected to the external electrode 16b.

The via hole conductors v11 to v15 and the wiring conductor 20c configure the signal path SL3 (refer to FIG. 2) connecting the external electrode 14c and the external electrode 16c. As illustrated in FIG. 3, the via hole conductor v15 penetrates the insulator layer 18e in the z-axis direction, and is connected to the external electrode 14c. Accordingly, the via hole conductor v15 is located inside the mounting area R in a planar view seen from the z-axis direction.

As illustrated in FIG. 3, the wiring conductor 20c preferably is a linear conductor provided on the back surface of the insulator layer 18d. In a planar view seen from the z-axis direction, one end of the wiring conductor 20c is connected to the via hole conductor v15. Accordingly, the one end of the wiring conductor 20c is located inside the mounting area R in a planar view seen from the z-axis direction. The other end of the wiring conductor 20c overlaps with the external electrode 16c in a planar view seen from the z-axis direction. Accordingly, the other end of the wiring conductor 20c is located outside the mounting area R in a planar view seen from the z-axis direction. In addition, the other end of the wiring conductor 20c is located nearest to the side L3 among the sides L1 to L4 in a planar view seen from the z-axis direction. In this way, in a planar view seen from the z-axis direction, the wiring conductor 20c extends from the inside of the mounting area R to the outside of the mounting area R between the main surface S1 and the ground conductor 22b.

As illustrated in FIG. 3, the via hole conductor v11 penetrates the insulator layer 18a in the z-axis direction, and is connected to the external electrode 16c. The via hole conductors v12 and v13 penetrate the insulator layers 18b and 18c in the z-axis direction, respectively, and overlap with the via hole conductor v11 in a planar view seen from the z-axis direction. Accordingly, the via hole conductors v11 to v13 (third via hole conductor) are located outside the mounting area R in a planar view seen from the z-axis direction. Furthermore, the via hole conductor v13 is connected to the other end of the wiring conductor 20c. Therefore, the via hole conductors v11 to v13 are provided nearest to the side L3 among the sides L1 to L4 in a planar view seen from the z-axis direction. Accordingly, in a planar view seen from the z-axis direction, the via hole conductors v11 to v13 connect the wiring conductor 20c and the external electrode 16c outside the mounting area R.

Furthermore, the via hole conductors v12 and v13 pass through the dents g3 and g6 provided in the ground conductors 22a and 22b, respectively. Accordingly, the via hole conductors v11 to v13 are not connected to the ground conductors 22a and 22b.

As illustrated in FIG. 2 and FIG. 3, the signal path SL3 configured in such a way as described above connects the external electrode 14c and the external electrode 16c. Furthermore, in a planar view seen from the z-axis direction, the signal path SL3 extends from the inside of the mounting area R to the outside of the mounting area R between the main surface S1 and the ground conductor 22b, passes through the outside of the mounting area R, and is connected to the external electrode 16c.

As illustrated in FIG. 3, the via hole conductor v16 penetrates the insulator layer 18a in the z-axis direction, and connects the external electrode 16d and the ground conductor 22a. Furthermore, in a planar view seen from the z-axis direction, the via hole conductor v16 is provided outside the mounting area R. In addition, in FIG. 3, so as to avoid the drawing from being complicated, a reference symbol is assigned to only the typical via hole conductor v16.

As illustrated in FIG. 3, the via hole conductor v17 (eighth via hole conductor) penetrates the insulator layer 18b in the z-axis direction, and connects the ground conductor 22a and the ground conductor 22b. Furthermore, in a planar view seen from the z-axis direction, the via hole conductor v17 is provided outside the mounting area R. In addition, in FIG. 3, so as to avoid the drawing from being complicated, a reference symbol is assigned to only the typical via hole conductor v17.

As illustrated in FIG. 3, the via hole conductor v18 (seventh via hole conductor) penetrates the insulator layer 18c in the z-axis direction, and is connected to the ground conductor 22b. Furthermore, in a planar view seen from the z-axis direction, the via hole conductor v18 is provided inside the mounting area R. In addition, in FIG. 3, so as to avoid the drawing from being complicated, a reference symbol is assigned to only the typical via hole conductor v18.

As illustrated in FIG. 3, the via hole conductor v19 (seventh via hole conductor) penetrates the insulator layer 18d in the z-axis direction, and is connected to the via hole conductor v18. Furthermore, in a planar view seen from the z-axis direction, the via hole conductor v19 is provided inside the mounting area R. In addition, in FIG. 3, so as to avoid the drawing from being complicated, a reference symbol is assigned to only the typical via hole conductor v19.

As illustrated in FIG. 3, the via hole conductor v20 (seventh via hole conductor) penetrates the insulator layer 18e in the z-axis direction, and connects the via hole conductor v19 and the external electrode 14d. Furthermore, in a planar view seen from the z-axis direction, the via hole conductor v19 is provided inside the mounting area R. In addition, in FIG. 3, so as to avoid the drawing from being complicated, a reference symbol is assigned to only the typical via hole conductor v19. Such via hole conductors v16 to v20 and ground conductors 22a and 22b as described above connect the external electrode 14d and the external electrode 16d.

In addition, as illustrated in FIG. 3, in a planar view seen from the z-axis direction, inside the mounting area R, a via hole conductor other than the via hole conductors v4 (fourth via hole conductor), v5 (fourth via hole conductor), v9 (fifth via hole conductor), v10 (fifth via hole conductor), v14 (sixth via hole conductor), and v15 (sixth via hole conductor), which connect the external electrodes 14a to 14c and the wiring conductors 20a to 20c, and the via hole conductors v18 to v20 connecting the external electrode 14d and the ground conductor 22b is not provided.

In addition, as illustrated in FIG. 3, along with the ground conductor 22a, the via hole conductor v17 is arranged so as to surround the via hole conductors v2, v7, and v12. The via hole conductor v17 surrounding the via hole conductors v2, v7, and v12 is located within a distance of three times to five times of the line widths of the wiring conductors 20a to 20c from the via hole conductors v2, v7, and v12.

In the circuit module 1 configured as described above, a transmission signal is input from the external electrode 16b. The transmission signal passes through the SAW filter 120a, and is output to the outside of the circuit module 1 through the external electrode 16a. Here, the SAW filter 120b has a pass band corresponding to the frequency band of a reception signal and has no pass band corresponding to the frequency band of the transmission signal. Accordingly, since it is difficult for the transmission signal having passed through the SAW filter 120a to pass through the SAW filter 120b, the transmission signal is not output from the external electrode 16c.

In addition, in the circuit module 1, the reception signal is input from the external electrode 16a. The reception signal passes through the SAW filter 120b, and is output to the outside of the circuit module 1 through the external electrode 16c. Here, the SAW filter 120a has a pass band corresponding to the frequency band of the transmission signal and has no pass band corresponding to the frequency band of the reception signal. Accordingly, since it is difficult for the reception signal having been input from the external electrode 16a to pass through the SAW filter 120a, the reception signal is not output from the external electrode 16b.

It is possible for the above-mentioned circuit module 1 to significantly reduce unnecessary interference occurring between a transmission signal and a reception signal. In more detail, as illustrated in FIG. 3, in the circuit substrate 10, the ground electrodes 22a and 22b overlap with the mounting area R so as to contain the mounting area R, in a planar view seen from the z-axis direction. Furthermore, in a planar view seen from the z-axis direction, the signal paths SL1 to SL3 extend to the outside of the mounting area R between the main surface S1 and the ground conductor 22b, passes through the outside of the mounting area R, and is connected to the external electrodes 16a to 16c. Accordingly, in a planar view seen from the z-axis direction, the ground electrodes 22a and 22b turn out to exist among the signal path SL1, the signal path SL2, and the signal path SL3. The ground conductors 22a and 22b are maintained at a ground potential. As a result, in the signal paths SL1 to SL3, it becomes possible to significantly reduce unnecessary interference occurring between the transmission signal and the reception signal.

Furthermore, in the circuit module 1, also on the basis of the following reason, it is possible to significantly reduce unnecessary interference between the transmission signal and the reception signal. In more detail, in the circuit substrate 10, in a planar view seen from the z-axis direction, the via hole conductors v1 to v3 in the signal path SL1 are located nearest to the side L1 among the side L1 to the side L4, the via hole conductors v6 to v8 in the signal path SL2 are located nearest to the side L2 among the side L1 to the side L4, and the via hole conductors v11 to v13 in the signal path SL3 are located nearest to the side L3 among the side L1 to the side L4. Accordingly, the via hole conductors v1 to v3, the via hole conductors v6 to v8, and the via hole conductors v11 to v13 are adjacent to different sides. In other words, the via hole conductors v1 to v3, the via hole conductors v6 to v8, and the via hole conductors v11 to v13 are disposed with being separate from one another. Owing to this, in the signal paths SL1 to SL3, it becomes possible to significantly reduce unnecessary interference occurring between the transmission signal and the reception signal.

In addition, as illustrated in FIG. 3, since the via hole conductors v2, v7, and v12 pass through the dents g1 to g3 of the ground conductor 22a, respectively, the via hole conductors v2, v7, and v12 are surrounded by the ground conductor 22a. The ground conductor 22a is maintained at the ground potential. Accordingly, in the signal paths SL1 to SL3, it becomes possible to significantly reduce unnecessary interference occurring between the transmission signal and the reception signal. Furthermore, the ground conductor 22a and the external electrode 16d are connected to each other by the via hole conductor v16, and the via hole conductor v16 is arranged so as to be adjacent to the via hole conductors v2, v7, and v12. Owing to this, it is possible to significantly reduce unnecessary interference occurring between the transmission signal and the reception signal inside the insulator layers 18a and 18b.

In addition, as illustrated in FIG. 3, the via hole conductor v17 is provided so as to surround the via hole conductors v2, v7, and v12. The via hole conductor v17 is maintained at the ground potential. Accordingly, in the signal paths SL1 to SL3, it becomes possible to significantly reduce unnecessary interference occurring between the transmission signal and the reception signal.

In addition, in a planar view seen from the z-axis direction, the via hole conductor v17 is not provided in the vicinity of the centers of the main surfaces S1 and S2 of the circuit substrate 10. Therefore, in the circuit substrate 10, it is possible to provide an inductor, a capacitor, or the like in an area overlapping with the centers of the main surfaces S1 and S2 in a planar view seen from the z-axis direction.

In addition, as illustrated in FIG. 3, in a planar view seen from the z-axis direction, in the circuit substrate 10, inside the mounting area R, a via hole conductor other than the via hole conductors v4, v5, v9, v10, v14, and v15, which connect the external electrodes 14a to 14c and the wiring conductors 20a to 20c, and the via hole conductors v18 and v20 connecting the external electrode 14d and the ground conductor 22b is not provided. Accordingly, it is possible to improve the degree of adhesion between the insulator layers 18. Furthermore, in the circuit substrate 10, it becomes possible to provide a circuit element, a wiring line, or the like in an area between the ground conductor 22a and the main surface S2.

In addition, in the circuit module 1, the ground conductor 22b provided nearest to the duplexer 110 contains the mounting area R in a planar view seen from the z-axis direction. Owing to this, a circuit within the duplexer 110 and a circuit within the circuit substrate 10 are kept from being electromagnetically coupled to each other.

In the circuit substrate 10, via hole conductors connecting the external electrode 16d and the ground conductor 22a are provided in the vicinities of the signal paths SL1 to SL3. Owing to this, it is possible to prevent a current from diffusing from the signal paths SL1 to SL3 in a direction toward the inside of the circuit substrate 10. As a result, it becomes possible to significantly reduce unnecessary interference occurring between the transmission signal and the reception signal.

Figure 4:
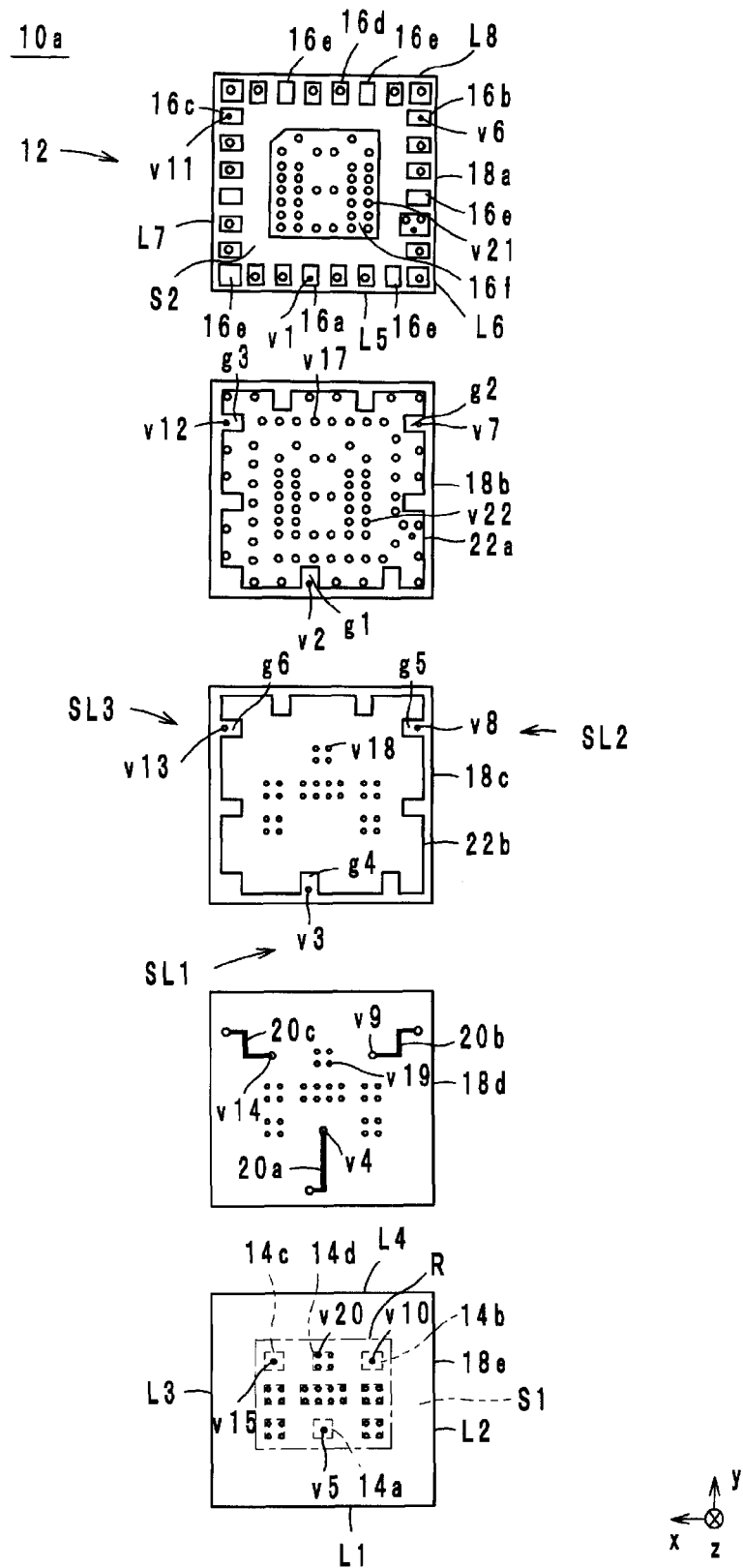
FIG. 4 is an exploded view of a circuit substrate of a circuit module according to an example of a first modification of a preferred embodiment of the present invention.

Hereinafter, the configuration of a circuit substrate 10a according to an example of a first modification of a preferred embodiment of the present invention will be described with reference to a drawing. FIG. 4 is the exploded view of the circuit substrate 10a of a circuit module 1 according to an example of the first modification.

The circuit substrate 10a is different from the circuit substrate 10 in that via hole conductors v21 and v22 are provided in the circuit substrate 10a. The via hole conductors v21 and v22 penetrate the insulator layers 18a and 18b in the z-axis direction, and are provided inside the mounting area R in a planar view seen from the z-axis direction. The via hole conductor v21 connects the external electrode 16f and the ground conductor 22a. The via hole conductor v22 connects the ground conductor 22a and the ground conductor 22b. In this way, the via hole conductors v21 and v22 other than the via hole conductors v18 and v19 connecting the external electrode 14d and the ground conductor 22b may be provided inside the mounting area R. In addition, in FIG. 4, so as to avoid the drawing from being complicated, reference symbols are assigned to only the typical via hole conductors v21 and v22.

Figure 5:
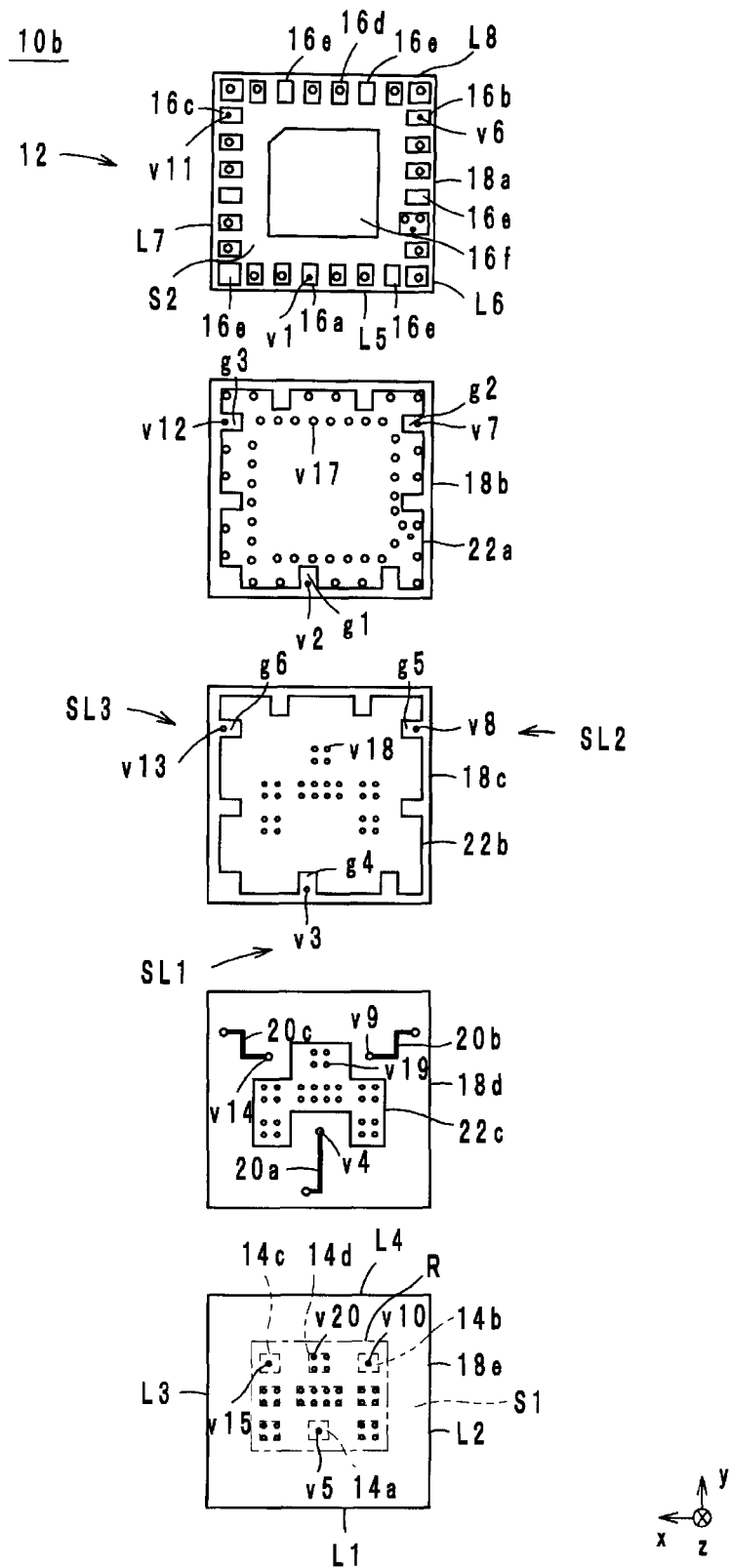
FIG. 5 is an exploded view of a circuit substrate of a circuit module according to an example of a second modification of a preferred embodiment of the present invention.

Hereinafter, the configuration of a circuit substrate 10b according to an example of a second modification of a preferred embodiment of the present invention will be described with reference to a drawing. FIG. 5 is the exploded view of the circuit substrate 10b of a circuit module 1 according to an example of the second modification.

The circuit substrate 10b is different from the circuit substrate 10 in that a ground conductor 22c (third ground electrode) is provided in the circuit substrate 10b. The ground conductor 22c is provided in the back surface of the insulator layer 18d, and overlaps with the mounting area R in a planar view seen from the z-axis direction. In this regard, however, the area of the ground conductor 22c is smaller than the area of the mounting area R. The ground conductor 22c is connected to the via hole conductors v19 and v20. In other words, the via hole conductor v20 connects the external electrode 14d and the ground conductor 22c. In addition, the via hole conductors v18 and v19 connect the ground conductor 22b and the ground conductor 22c. Owing to this, the ground conductor 22c is maintained at the ground potential. As illustrated in FIG. 5, the ground conductor 22c is provided among the wiring conductors 20a to 20c. Therefore, in the signal paths SL1 to SL3, it becomes possible to significantly reduce unnecessary interference occurring between the transmission signal and the reception signal.

Furthermore, since the ground conductor 22c is provided, it is possible to significantly reduce parasitic inductance occurring in the ground of the duplexer 110, and it is possible to improve the characteristic of the duplexer 110.

Furthermore, the area of the ground conductor 22c is smaller than the area of the mounting area R. Therefore, by adjusting the area of the ground conductor 22c, it becomes possible to adjust an area where the ground conductor 22c and the duplexer 110 face each other. As a result, it becomes possible to adjust the attenuation characteristic of the duplexer 110.

Furthermore, while the ground conductor 22c is connected to all the ground terminals of the SAW filters 120a and 120b, only a specific ground terminal in particular influencing an isolation characteristic may be connected to the ground conductor 22c.

In addition, while the ground conductors 22a and 22b preferably have a same shape in the circuit substrates 10, 10a, and 10b, the ground conductors 22a and 22b may have different shapes. Owing to this, it becomes possible to enhance the flexibility of the arrangement of the signal paths SL1 to SL3.

In addition, in the circuit substrates 10, 10a, and 10b, the via hole conductors v17 surrounding the via hole conductors v2, v7, and v12 may have a diameter larger than the other via hole conductors v17. Owing to this, it is possible to significantly reduce impedance occurring in the via hole conductors v17 surrounding the via hole conductors v2, v7, and v12. Accordingly the via hole conductor v17 becomes easy to maintain at the ground potential. As a result, in the signal paths SL1 to SL3, it becomes possible to significantly reduce unnecessary interference occurring between the transmission signal and the reception signal.

In addition, in the circuit substrates 10, 10a, and 10b, while it is assumed that the via hole conductors v2, v7, and v12 pass through the dents g1 to g3 provided in the ground conductor 22a, the via hole conductors v2, v7, and v12 may also pass through holes provided in the ground conductor 22a.

In addition, in each of the circuit substrates 10, 10a, and 10b, in a planar view seen from the z-axis direction, the signal paths SL1 to SL3 extend from the inside of the mounting area R to the outside of the mounting area R between the main surface S1 and the ground conductor 22b, pass through the outside of the mounting area R, and are connected to the external electrodes 16a to 16c, respectively. However, in a planar view seen from the z-axis direction, it is only necessary for at least one of the signal paths SL1 to SL3 to extend from the inside of the mounting area R to the outside of the mounting area R between the main surface S1 and the ground conductor 22b, pass through the outside of the mounting area R, and be connected to the external electrodes 16a to 16c.

Furthermore, in the circuit module 1, while the duplexer 110 is only mounted in the circuit substrates 10, 10a, and 10b, a passive element such as a switch, a coil, or a capacitor may be mounted. In addition, while a conductor is provided in each insulator layer 18 in the circuit substrates 10, 10a, and 10b, an insulator layer 18 may be provided where no conductor is provided.

As described above, preferred embodiments of the present invention are useful for a composite component, and in particular, provide an advantage in that it is possible to significantly reduce unnecessary interference occurring between various types of signals.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite component comprising:
   a duplexer; and
   a circuit substrate on which the duplexer is mounted;
   wherein
   the duplexer includes:
   a first external electrode, a second external electrode and a third external electrode;
   a first filter that outputs a signal input from the first external electrode to the second external electrode; and
   a second filter that outputs a signal input from the third external electrode to the first external electrode; and
   the circuit substrate includes:
   a substrate body that includes a first main surface and a second main surface, the duplexer being mounted on the first main surface;
   a fourth external electrode, a fifth external electrode, and a sixth external electrode that are provided on the first main surface and to which the first external electrode, the second external electrode and the third external electrode are connected, respectively;
   a seventh external electrode, an eighth external electrode, and a ninth external electrode that are provided on the second main surface;
   a first signal path that connects the fourth external electrode and the seventh external electrode, a second signal path that connects the fifth external electrode and the eighth external electrode, a third signal path that connects the sixth external electrode and the ninth external electrode; and a first ground conductor that is embedded in the substrate body and overlaps with a mounting area so as to contain the mounting area where the duplexer is mounted, in a planar view seen from a normal direction of the first main surface, wherein in the planar view seen from the normal direction of the first main surface, at least one of the first signal path, the second signal path and the third signal path extends from an inside of the mounting area to an outside of the mounting area between the first main surface and the first ground conductor, passes through the outside of the mounting area, and is connected to the seventh external electrode, the eighth external electrode and the ninth external electrode.

2. The composite component according to claim 1, wherein the first signal path includes:
a first wiring conductor that extends from the inside of the mounting area to the outside of the mounting area between the first main surface and the first ground conductor in the planar view seen from the normal direction of the first main surface; and
a first via hole conductor that connects the first wiring conductor and the seventh external electrode in the outside of the mounting area in the planar view seen from the normal direction of the first main surface.

3. The composite component according to claim 2, wherein the first via hole conductor passes through a hole provided in the first ground conductor.

4. The composite component according to claim 2, wherein the first via hole conductor passes through a dent provided in an outer edge of the first ground conductor.

5. The composite component according to claim 2, wherein the second signal path includes:
a second wiring conductor that extends from the inside of the mounting area to the outside of the mounting area between the first main surface and the first ground conductor in the planar view seen from the normal direction of the first main surface; and
a second via hole conductor that connects the second wiring conductor and the eighth external electrode in the outside of the mounting area in the planar view seen from the normal direction of the first main surface.

6. The composite component according to claim 5, wherein the third signal path includes:
a third wiring conductor that extends from the inside of the mounting area to the outside of the mounting area between the first main surface and the first ground conductor in the planar view seen from the normal direction of the first main surface; and
a third via hole conductor that connects the third wiring conductor and the ninth external electrode in the outside of the mounting area in the planar view seen from the normal direction of the first main surface.

7. The composite component according to claim 6, wherein the first main surface has a rectangular or substantially rectangular shape including a first side, a second side, a third side and a fourth side in the planar view seen from the normal direction of the first main surface; and
in the planar view seen from the normal direction of the first main surface, the first via hole conductor is provided in a position nearest to the first side among the first side, the second side, the third side and the fourth side, the second via hole conductor is provided in a position nearest to the second side among the first side, the second side, the third side, and the fourth side, and the third via hole conductor is provided in a position nearest to the third side among the first side, the second side, the third side, and the fourth side.

8. The composite component according to claim 7, wherein the circuit substrate further includes:
a fourth via hole conductor, a fifth via hole conductor, and a sixth via hole conductor that connect the fourth external electrode, the fifth external electrode and the sixth external electrode and the first wiring conductor, the second wiring conductor, and the third wiring conductors;
a tenth external electrode provided in the first main surface; and
a seventh via hole conductor that connects the tenth external electrode and the first ground conductor; wherein
in the planar view seen from the normal direction of the first main surface, a via hole conductor other than the fourth via hole conductor, the fifth via hole conductor, the sixth via hole conductor and the seventh via hole conductor is not provided inside the mounting area.

9. The composite component according to claim 8, wherein the circuit substrate further includes:
a second ground conductor that overlaps with the mounting area in the planar view seen from the normal direction of the first main surface and is provided between the second main surface and the first ground conductor; and
an eighth via hole conductor that connects the first ground conductor and the second ground conductor.

10. The composite component according to claim 1, wherein the circuit substrate further includes a third ground conductor that is embedded in the substrate body and provided between the first main surface and the first ground conductor.

11. The composite component according to claim 9, wherein in the planar view seen from the normal direction of the first main surface, at least a portion of the second ground conductor surrounds the first via hole conductor, the second via hole conductor, and the third via hole conductor along with the first side, the second side, the third side, and the fourth side of the circuit substrate.

12. The composite component according to claim 1, further comprising via hole conductors disposed in the circuit substrate.

13. The composite component according to claim 12, wherein the via hole conductors disposed in the circuit substrate are located in the mounting area in which the duplexer is mounted in the planar view seen from the normal direction of the first main surface.

14. The composite component according to claim 12, wherein the via hole conductors are connected to at least one of the first ground conductor and one of the external electrodes.

15. The composite component according to claim 1, wherein the circuit substrate has a rectangular or substantially rectangular parallelepiped shape.

16. The composite component according to claim 1, wherein the circuit substrate is a multilayer laminated body including a plurality of insulator layers laminated on each other.

17. The composite component according to claim 1, wherein the composite component is a circuit module.

18. A communication device comprising the composite component according to claim 1.

19. The communication device according to claim 18, wherein the communication device is a mobile phone.

20. The communication device according to claim 18, wherein the composite component defines a portion of a transmission and reception circuit.

* * * * *